US010867681B2

(12) United States Patent
Clinton et al.

(10) Patent No.: US 10,867,681 B2
(45) Date of Patent: Dec. 15, 2020

(54) SRAM MEMORY HAVING SUBARRAYS WITH COMMON IO BLOCK

(71) Applicant: Taiwan Semiconductor Manufacturing Company, Ltd., Hsinchu (TW)

(72) Inventors: Michael Clinton, Austin, TX (US); Bryan David Sheffield, Austin, TX (US); Marty Tsai, Hsinchu (TW); Rajinder Singh, Hsinchu (TW)

(73) Assignee: Taiwan Semiconductor Manufacturing Company, LTD., Hsinchu (TW)

( * ) Notice: Subject to any disclaimer, the term of this patent is extended or adjusted under 35 U.S.C. 154(b) by 0 days.

(21) Appl. No.: 16/240,175

(22) Filed: Jan. 4, 2019

(65) Prior Publication Data

US 2019/0295656 A1    Sep. 26, 2019

Related U.S. Application Data

(60) Provisional application No. 62/647,422, filed on Mar. 23, 2018.

(51) Int. Cl.
| | |
|---|---|
| *G11C 16/24* | (2006.01) |
| *G11C 16/08* | (2006.01) |
| *G11C 16/26* | (2006.01) |
| *G11C 7/10* | (2006.01) |
| *G11C 7/12* | (2006.01) |
| *G11C 7/18* | (2006.01) |
| *G11C 11/417* | (2006.01) |
| *G11C 11/419* | (2006.01) |

(52) U.S. Cl.
CPC .............. *G11C 16/24* (2013.01); *G11C 7/106* (2013.01); *G11C 7/1039* (2013.01); *G11C 7/12* (2013.01); *G11C 7/18* (2013.01); *G11C 11/417* (2013.01); *G11C 11/419* (2013.01); *G11C 16/08* (2013.01); *G11C 16/26* (2013.01)

(58) Field of Classification Search
CPC ......... G11C 16/24; G11C 16/26; G11C 16/08; G11C 7/18; G11C 7/12; G11C 7/1039; G11C 7/106; G11C 11/419; G11C 11/417
See application file for complete search history.

(56) References Cited

U.S. PATENT DOCUMENTS

| | | | | |
|---|---|---|---|---|
| 7,289,372 B1 | 10/2007 | Yu et al. | | |
| 7,830,712 B2 * | 11/2010 | Park | ...................... | G11C 16/26 365/185.12 |

(Continued)

FOREIGN PATENT DOCUMENTS

| | | |
|---|---|---|
| CN | 101136242 A | 3/2008 |
| KR | 10-2016-0019595 A | 2/2016 |

*Primary Examiner* — Gene N Auduong
(74) *Attorney, Agent, or Firm* — Merchant & Gould P.C.

(57) ABSTRACT

A memory device includes an array of memory cells that has a first sub array and a second sub array. A plurality of bit lines are connected to the memory cells, and an IO block is situated between the first sub array and the second sub array. The bit lines extend from the first and second memory sub arrays of the memory device directly to the IO block. The IO block further includes data input and output terminals configured to receive data to be written to the array of memory cells and output data read from the array of memory cells via the plurality of bit lines.

20 Claims, 10 Drawing Sheets

(56) References Cited

U.S. PATENT DOCUMENTS

| | | | |
|---|---|---|---|
| 8,773,939 B2* | 7/2014 | Oh | G11C 5/04 |
| | | | 365/230.03 |
| 9,750,158 B2 | 2/2017 | Mathuria et al. | |
| 2012/0287729 A1* | 11/2012 | Hirobe | G11C 7/10 |
| | | | 365/189.05 |
| 2012/0294059 A1* | 11/2012 | Oh | G11C 5/04 |
| | | | 365/63 |
| 2016/0042785 A1 | 2/2016 | Rim et al. | |
| 2019/0333546 A1* | 10/2019 | Fukushi | G11C 29/76 |

* cited by examiner

SRAM MEMORY HAVING SUBARRAYS WITH COMMON IO BLOCK

This application claims priority to U.S. Provisional Patent Application No. 62/647,422, titled "FOLDED MEMORY ARCHITECTURE," filed Mar. 23, 2018, the disclosure of which is hereby incorporated by reference in its entirety.

BACKGROUND

A common type of integrated circuit memory is a static random access memory (SRAM) device. A typical SRAM memory device has an array of memory cells. Each memory cell uses six transistors, for example, connected between an upper reference potential and a lower reference potential (typically ground) such that one of two storage nodes can be occupied by the information to be stored, with the complementary information stored at the other storage node.

SRAM memory is often used for computing applications, such as implementing a cache memory. A central processing unit (CPU) cache is a hardware cache used by the CPU. CPUs access data from a main memory location, but this operation is time consuming and inefficient. A cache is used to provide faster access to frequently used data by storing that data locally. A cache provides a smaller memory capacity, but being located close to the CPU allows the CPU's request for frequented data to be significantly sped up. In some examples, caches are organized as a hierarchy of several levels (L1, L2, etc.). In a hierarchal cache, the L1 level is located closest to the CPU. As such, the capacity of the L1 cache is small but the access speed is the fastest. Since it provides words of data or instructions directly to the CPU, the L1 cache typically operates at the same clock speed as the CPU.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
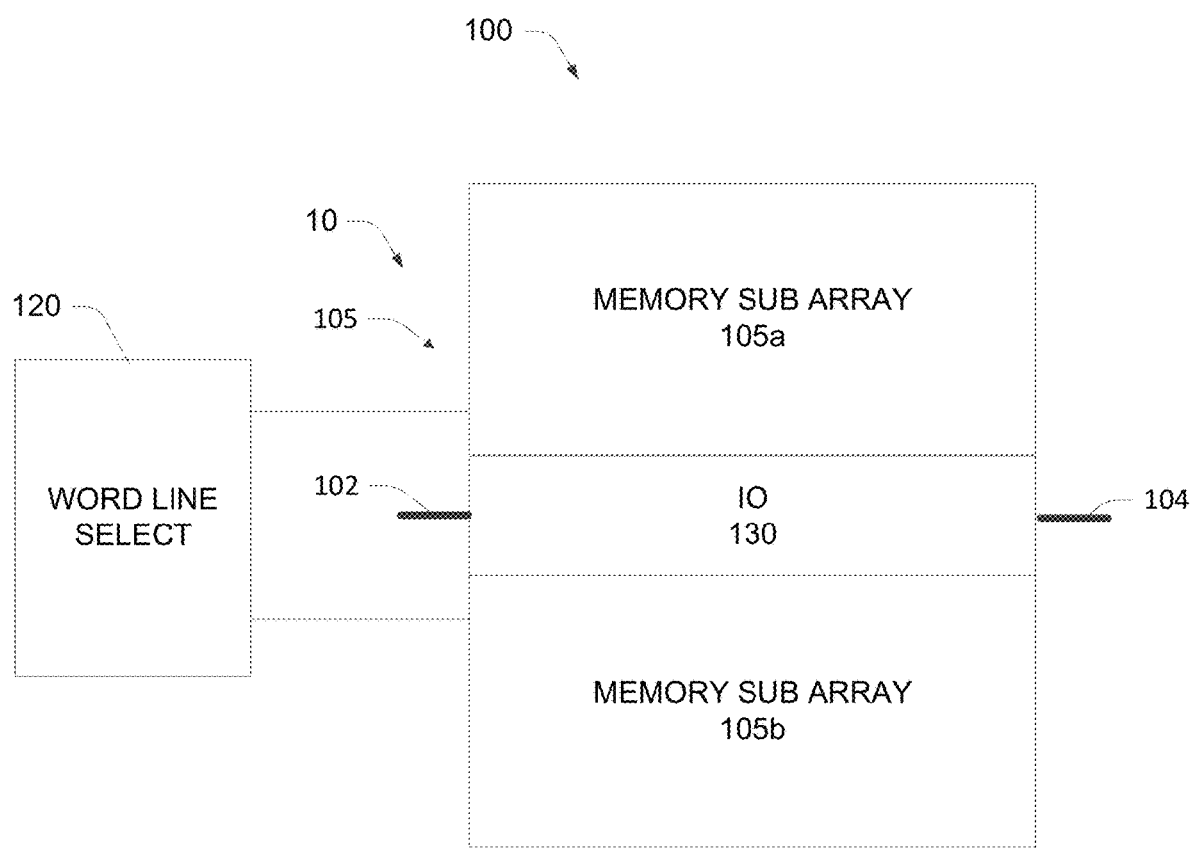
FIG. 1 is a block diagram illustrating aspects of an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices, such as static random access memory (SRAM), have memory cells arranged in an array of rows and columns. The memory cells are connected to a row decoder via word lines. Additionally, the memory cell array contains bit lines connecting the columns of a plurality of individual memory cells to an Input/Output (IO) block. Thus, the bit lines of each column are respectively coupled to a plurality of memory cells that are disposed in that column, and each memory cell in that column is arranged on a different row and coupled to a respective word line. Typically, the bit lines extend in one direction (parallel to a first axis) and the word lines extend in a second direction (parallel to a second axis) perpendicular to the first direction. The IO block is connected to a control which implements the control logic of the memory architecture.

SRAM memory is often used implementing various cache memory arrangements, such as a L1, L2, etc. caches. In a hierarchal cache, the L1 level is located closest to the CPU. As such, the capacity of the L1 cache is small but the access speed is the fastest. Since it provides words of data or instructions directly to the CPU, the L1 cache typically operates at the same clock speed as the CPU.

Area in the CPU is often a concern, so the L1 cache sometimes is required use long bit lines and long word lines to achieve the smallest memory area. These long and heavily loaded bit lines may cause degradation in cache performance. The reason for this is that the resistance of each bit line, which increases with bit line length, causes a delay in the memory cell access time. Reducing the length and number of bits along the bit line will improve the performance of the memory.

Some solutions attempt to reduce the length of the bit lines while maintaining the same total number of bits by creating sub-banks of smaller memory cell arrays, each with shorter bit lines. Local IO structures with multiplexers assemble information from the sub-banks, which is then transmitted to a global IO using global bit lines. Such structures may impart additional time delays, possibly reducing the benefit of shortening the bit line length. In addition, the area required to implement this design increases, thus decreasing the CPU's area, further hurting the CPU's performance.

In accordance with some disclosed examples, to improve the performance of the memory device, a "Folded Architecture" of the memory is employed. This "Folded Architecture" shortens the length of the bit lines, while eliminating the need for the global bit lines, thus increases the access speed of the memory while minimally impacting the CPU area in implementations such as an L1 cache. In some embodiments, the disclosed memory arrangement invention is described as being implemented as an SRAM on for an L1 cache, but other embodiments are possible.

FIG. 1 is a block diagram illustrating an example of a memory device 100 in accordance with aspects of the present disclosure. In the illustrated embodiment of FIG. 1, the memory device 100 includes a memory cell array 105, an input/output (IO) block 130, and a word line driver 120. The memory cell array 105 is divided into two memory sub arrays 105a, 105b, positioned on opposite sides of the IO block 130 and directly connected thereto.

Figure 2:
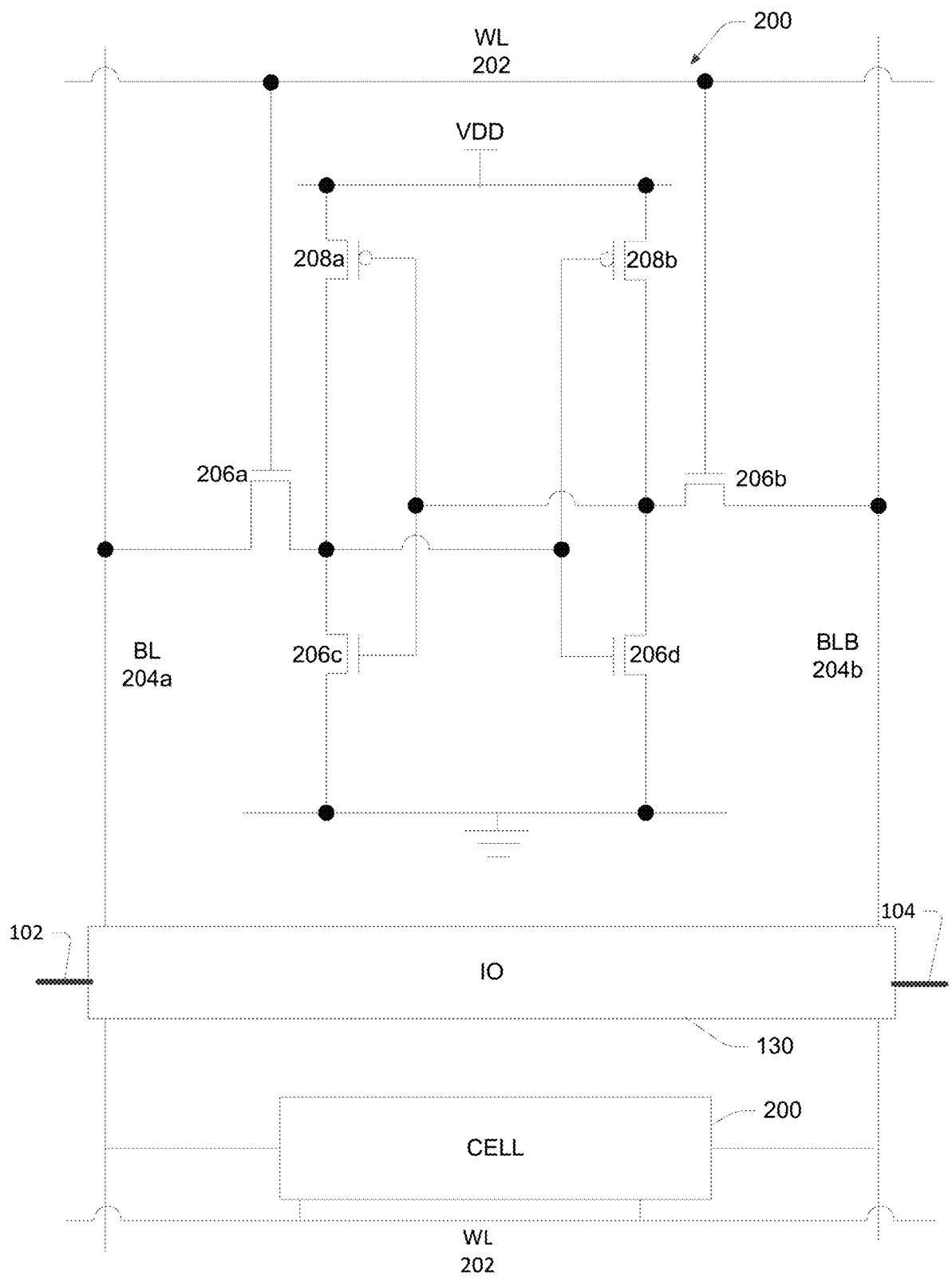
FIG. 2 is a circuit diagram of an example of a static random access memory (SRAM) cell in accordance with some embodiments.

As noted above, in some embodiments the memory device 100 is an SRAM memory, and thus the memory array 105 is an array of SRAM memory cells. FIG. 2 illustrates an example of an SRAM memory cell 200 of the memory cell array 105 shown in FIG. 1. The memory cell 200 is connected to a word line 202 and complementary bit lines BL 204a and BLB 204b. As will be discussed further below, the sub arrays 105a, 105b are situated on either side of the IO block 130, and the bit lines 204a, 204b are directly connected to the IO block 130. The IO block 130 includes a data input terminal 102 and an output terminal 104, which respectively receive data for writing to the memory sub arrays 105a, 105b, and output data read from the memory sub arrays 105a, 105b.

The memory cell 200 includes PMOS transistors 208a-b and NMOS transistors 206a-d. The transistors 208a and 206c are coupled to one another and positioned between the supply voltage VDD and ground to form an inverter. Similarly, the transistors 208b and 206d are coupled between VDD and ground to form a second inverter. The two inverters are cross-coupled to each other. An access transistor 206a connects the output of the first inverter to the bit line BL 204a. Similarly, the access transistor 206b connects the output of the second inverter to the bit line bar 204b. The word line 202 is attached to the gate controls of the access transistors 206a and 206b to selectively couple the outputs of the inverters to the bit lines 204a, 204b during read/write operations in response to the word line driver 120 shown in FIG. 1. During a read operation the inverters drive the complementary voltage levels at the bit lines 204a, 204b.

The cross coupled inverters of the memory cell 200 provide two stable voltage states denoting logic values 0 and 1. Metal-Oxide Semiconductor Field Effect Transistors (MOSFETs) are typically used as the transistors in the memory cell 200. In some embodiments more or fewer than 6 transistors may be used to implement the memory cell 200.

Figure 3:
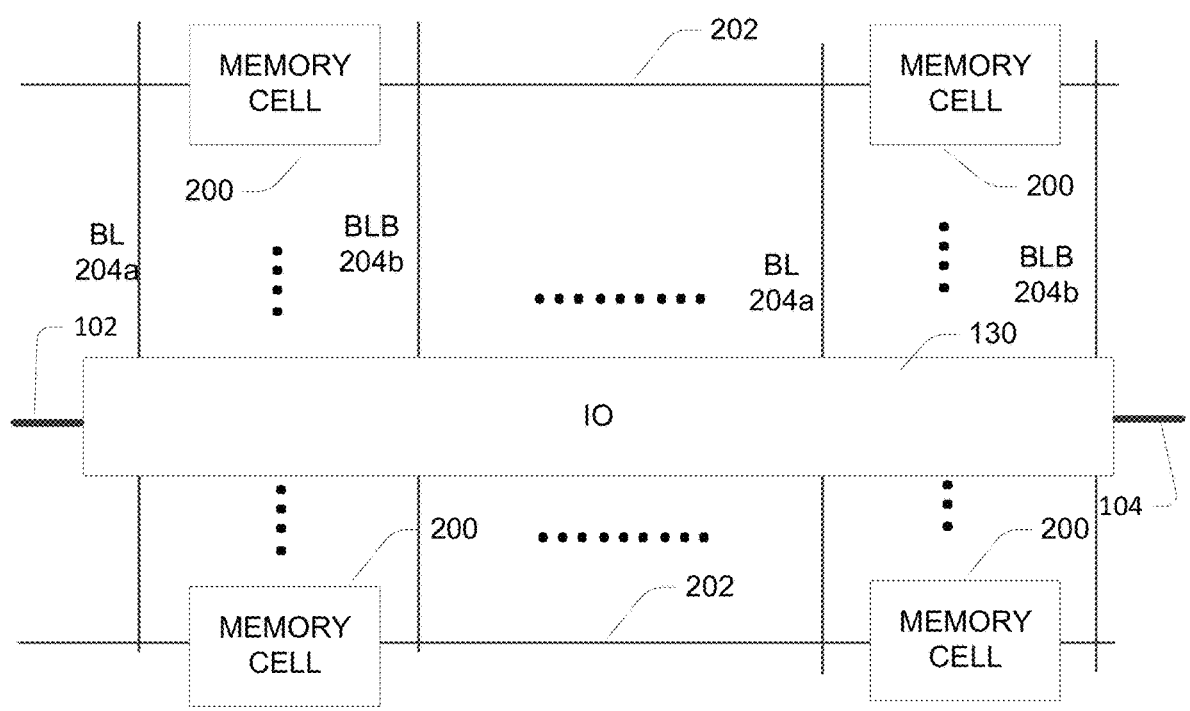
FIG. 3 is a bock diagram illustrating further aspects of an example of the memory shown in FIG. 1 in accordance with some embodiments.

FIG. 3 illustrates further aspects of the memory device 100. In some embodiments, the memory cell sub arrays 105a, 105b each include a plurality of the memory cells 200 arranged in a column-row configuration in which each column has a bit line 204a and a bit line bar 204b, and each row has a word line 202. More specifically, the bit lines 204a, 204b of each column are respectively coupled to a plurality of the memory cells 200 that are disposed in that column, and each memory cell 200 in that column is arranged on a different row and coupled to a respective (different) word line 202. That is, each memory cell 200 of the memory cell array 110 is coupled to a bit line 204a of a column of the memory cell array 110, a bit line bar 204b of the column of the memory cell array 110, and a word line 202 of a row of the memory cell array 110. In some embodiments, the bit lines 204a and bit lines bar 204b are arranged in parallel vertically and the word lines 202 are arranged in parallel horizontally (i.e., perpendicular to the bit lines 204a, 204b. The bit lines 204a, 204b of the memory cells 200 of the sub arrays 105a, 105b extend directly to the IO block 130, which includes the data input terminal 102 and an output terminal 104 for respectively writing and reading data to and from the memory cells 200.

Figure 4:
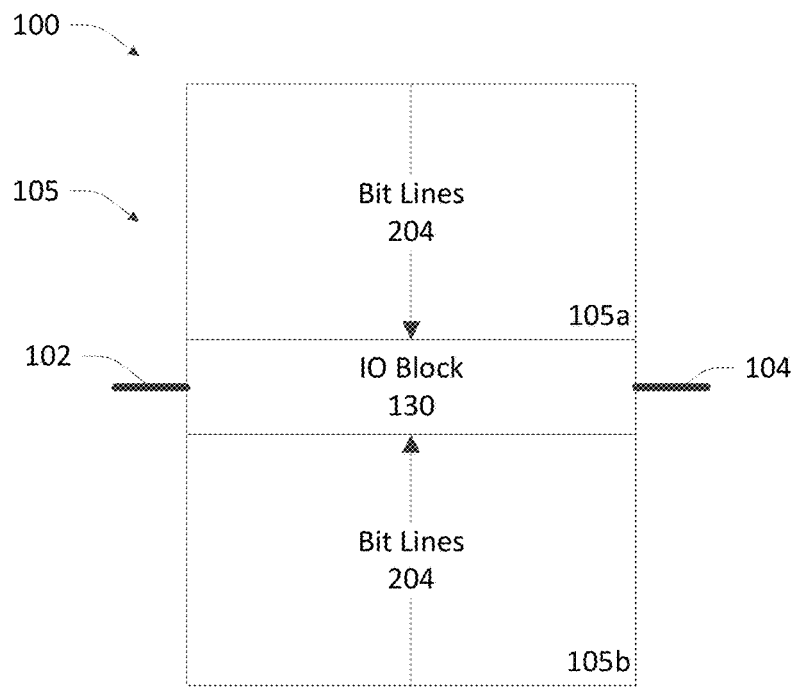
FIG. 4 is a block diagram illustrating further aspects of an example of the memory shown in FIG. 1 in accordance with some embodiments.

Referring now to FIG. 4, further aspects of the memory device 100 in accordance with disclosed embodiments are illustrated. The memory device 100 includes an array of memory cells 105, which includes a first sub array 105a and a second sub array 105b. A plurality of bit lines 204 are connected to the memory cells 105, and an IO block 130 is situated between the first sub array 105a and the second sub array 105b. As noted above, in certain memory applications such as for an L1 cache, high speed access to the memory array is desirable. To shorten the bit lines and improve performance, the bit lines 204 extend from the first and second memory sub arrays 105a, 105b of the memory device 100 directly to the IO block 130. The IO block 130 includes a data input terminal 102 and an output terminal 104, which output data from the bit lines 204 and input data to the bit lines 204.

The memory device 100 shown in FIGS. 1-4 provides a "folded" memory array arrangement, in that essentially a mirror image of the memory structure is created by the position of the IO block 130 extending horizontally across the memory array 105 so as to divide the array 105 into the first and second sub arrays 105a, 105b dividing the folded memory architecture 100.

The illustrated "folded" arrangement where the IO block 130 directly receives the bit lines 204 from both memory sub arrays 105a, 105b, allows the bit line 204 length to be reduced to roughly half that of a more conventional arrangement where the bit lines extend to an IO block at one end of the memory array. In other conventional arrangements, bit lines from memory sub arrays have local bit lines that extend to a centrally located local IO block. However, global bit lines are additionally required to send and receive data between the local IO block and a global IO block to communicate outside the memory array. Since the bit lines 204 for the entire array 105, including the first and second sub arrays 105a, 105b are received by the IO block 130 that includes the input and output terminals 102,104, additional components such as the global bit lines and global IO block are not required in the examples of the device 100 disclosed herein. As discussed further below, in some embodiments of the folded or mirror image arrangement shown in FIGS. 1-4, the first and second sub arrays have respective first and second IO blocks situated between the two sub arrays. In some examples, the first and second IO blocks may be dedicated respectively to the upper sub array and the lower sub array. Moreover, since the first and second IO blocks are located next to one another between the sub arrays, for additional efficiency and space saving some components of the IO blocks may be dedicated to the upper sub array, some components may be dedicated to the lower sub array, and some components may be shared between the sub arrays.

Figure 5:
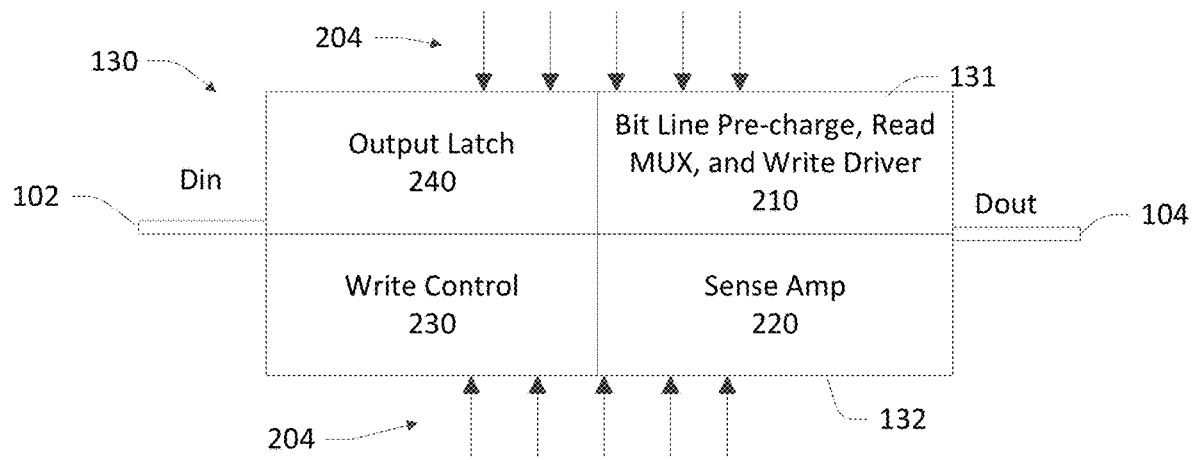
FIG. 5 is a block diagram illustrating an example of a memory IO block in accordance with some embodiments.

FIG. 5 is a block diagram illustrating further aspects of the IO block 130. The IO block 130 has a first, or top side 131 and a second, or bottom side 132 opposite the first side 131. The top side 131 receives a first plurality of the bit lines 204 from the first memory sub array 105a, and the bottom side 132 receives a second plurality of the bit lines 204 from the second memory sub array 105b.

The IO block 130 includes various control blocks for reading and writing data to and from the memory array 105. The bit lines 204 of both sub arrays 105a, 105b connect to the IO block 130 which may include, for example, a bit line pre-charge, multiplexer (MUX) and write driver block 210, a sense amplifier 220, a write control 230, and an output latch 240. The data-in terminal 102 and data-out terminal 104 receive and output data from the memory device 100 to components external thereto.

Figure 6:
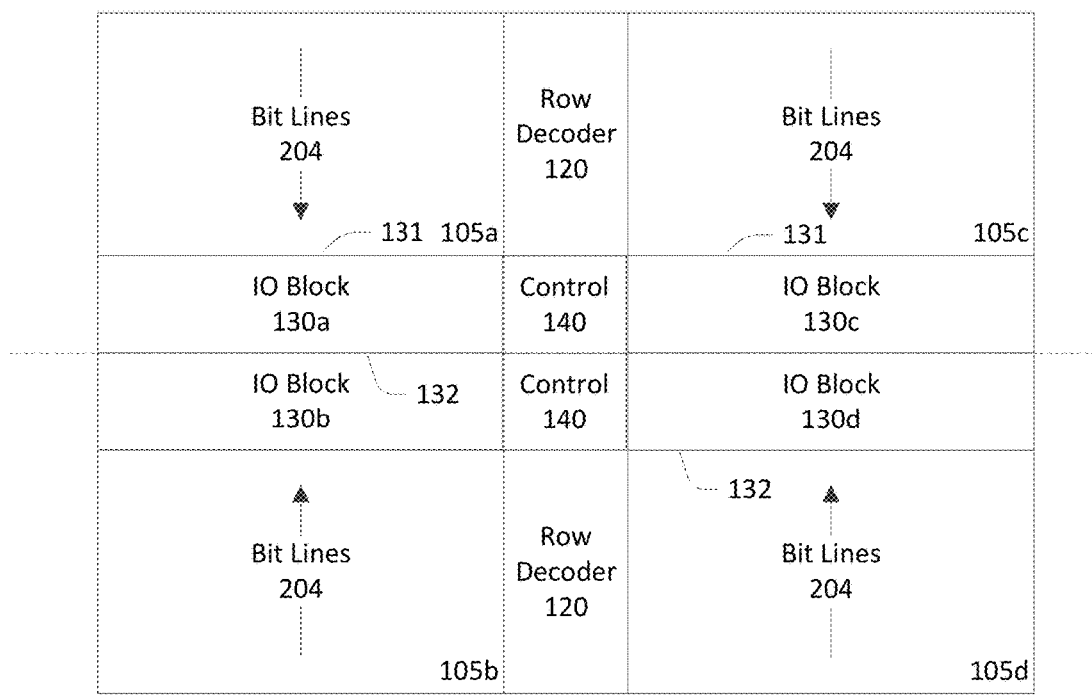
FIG. 6 is a block diagram illustrating another example of a memory device in accordance with some embodiments.
Figure 7:
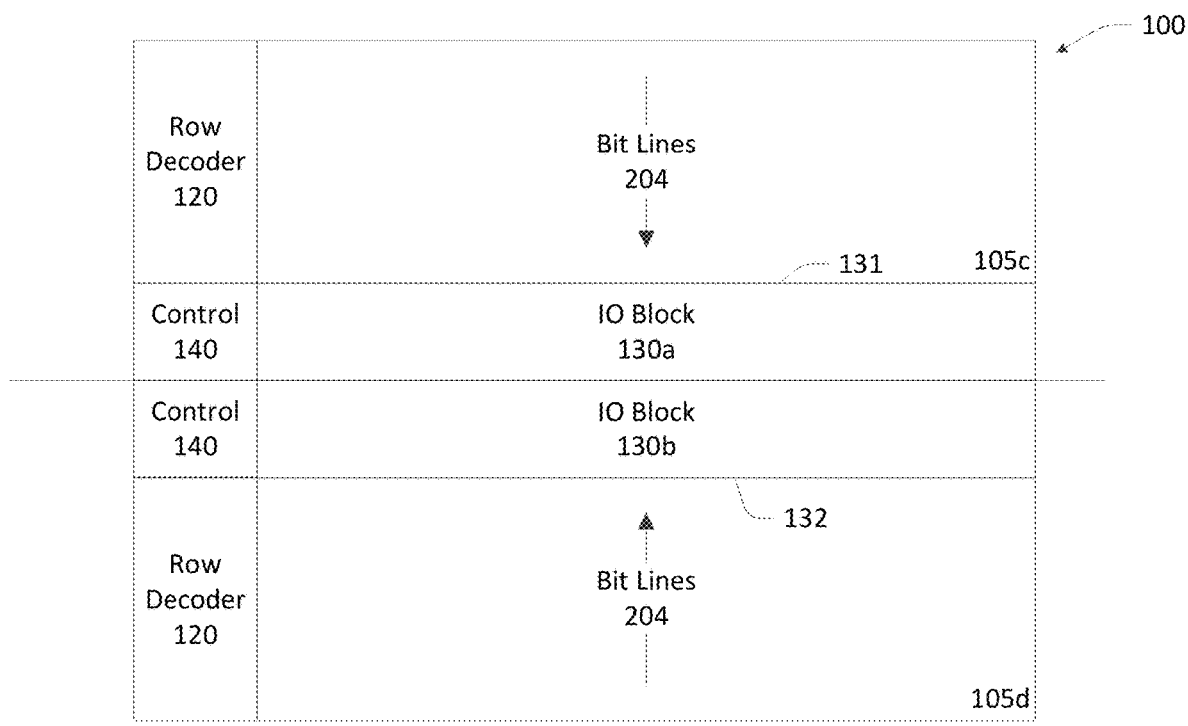
FIG. 7 is a block diagram illustrating another example of a memory device in accordance with some embodiments.

FIG. 6 illustrates another example of the memory device 100, depicting a "butterfly" type design where a row decoder 120 and control 140 extend generally parallel to the bit lines 204 (vertically in FIG. 6), and are centrally located between the memory cell array 105 so as to further divide the array 105 into a third sub array 105c and a fourth sub array 105d. FIG. 7 illustrates another example where the row decoders 120 and the controls 140 are positioned at one side of the memory array 105. As with the example shown in FIG. 4, the bit lines 204 extend from the opposite sides (upper and lower sides) of the IO block 130, such that the IO components are situated in the middle of the array 105. Various periphery components may also be shared between the upper sub array(s) 105a, 105c, and the lower array(s) 105b, 105d.

As mentioned previously, various periphery components of the IO block 130 may be shared between the memory cells of the sub arrays 105a, 105b. This can further reduce the macro area required to implement the memory device 100 disclosed herein. Positioning IO blocks for the sub arrays 105a, 105b next to each other between the sub arrays 105a, 105b allows sharing various components of the IO block 130 among the memory sub arrays 105a, 105b, which takes better advantage of the shortened bit lines 204, without significantly impact macro area. This optimizes the performance of both the memory device and components connected thereto and can reduce redundancy of components of the IO blocks. As noted above, memory implementations such as an L1 cache require fast access speed while minimizing space.

In some examples, the IO block 130 includes first and second IO blocks 130a, 130b, which are connected to the bit lines 204 of the respective first and second sub arrays 105a, 105b. FIG. 7 illustrates such an arrangement. Moreover, in devices where the row decoders 120 further divide the memory array into the third and fourth sub arrays 105c, 105d, corresponding third and fourth memory blocks 130c, 130d may be employed as shown in FIG. 6. In the examples of FIG. 6 and FIG. 7, all of the control blocks 130 are positioned between the upper and lower sub arrays 105a, 105b (and 105c, 105d), and as such are centrally located to allow for shortened bit lines 204 received at the upper and lower sides 131, 132 of the IO blocks 130.

In this manner, some or all of the IO functions may be dedicated to the memory cells and bit lines 204 of the respective sub arrays. This may improve performance of the memory device 100.

Figure 8:
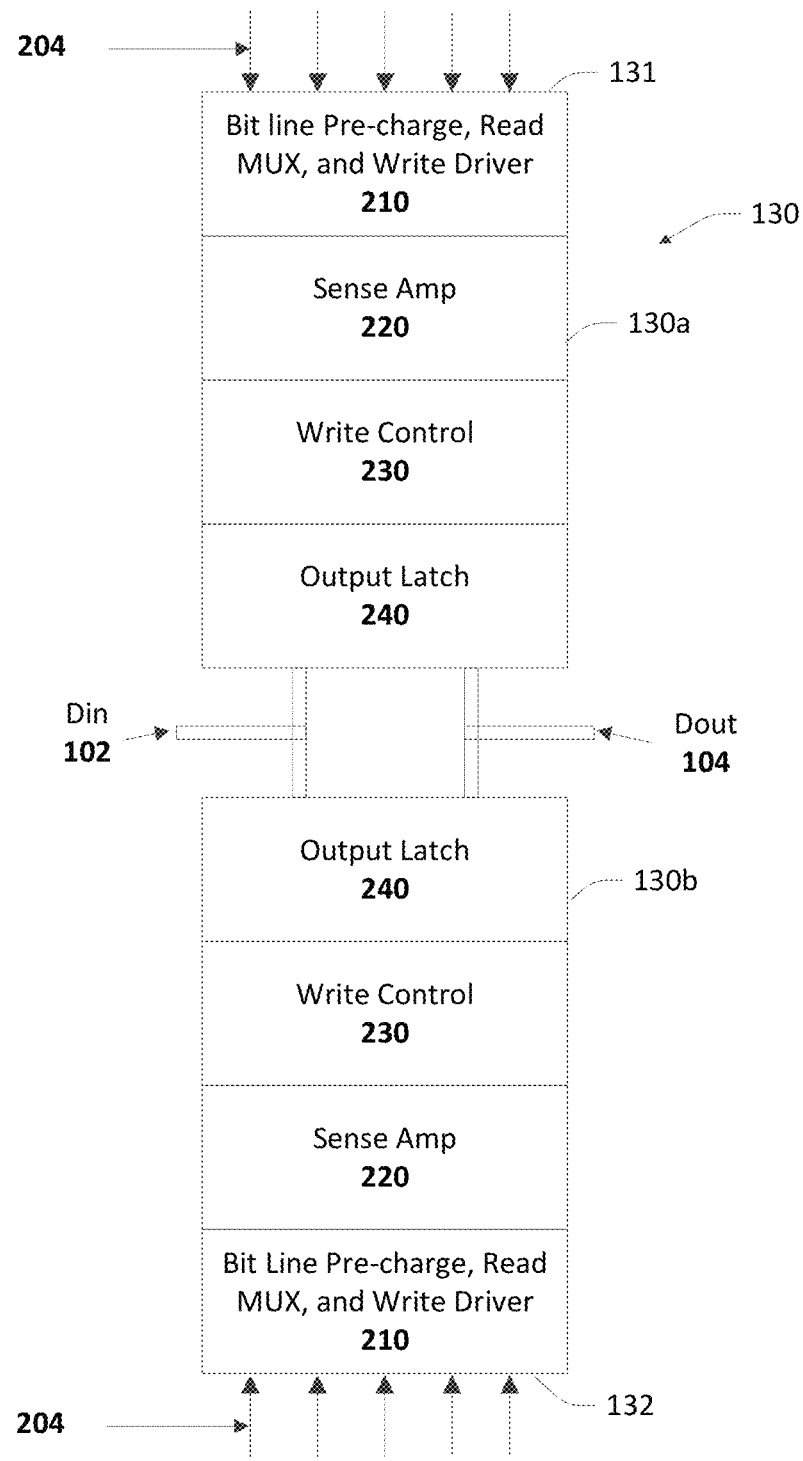
FIG. 8 is a block diagram illustrating another example of a memory input/output (IO) block in accordance with some embodiments.

FIG. 8 illustrates aspects of an example of the IO block 130, where various components of the IO block 130 are provided in first and second IO blocks 130a, 130b, situated generally as mirror images of one another. As shown in FIG. 8, each of the IO blocks 130a, 130b include a bit line pre-charge, read MUX and write driver block 210, a sense amp 220, write control 230, and output latch 240. A data IO layer including the Din 102 and Dout 104 terminals is situated between the upper and lower control blocks 130a, 130b.

Figure 9:
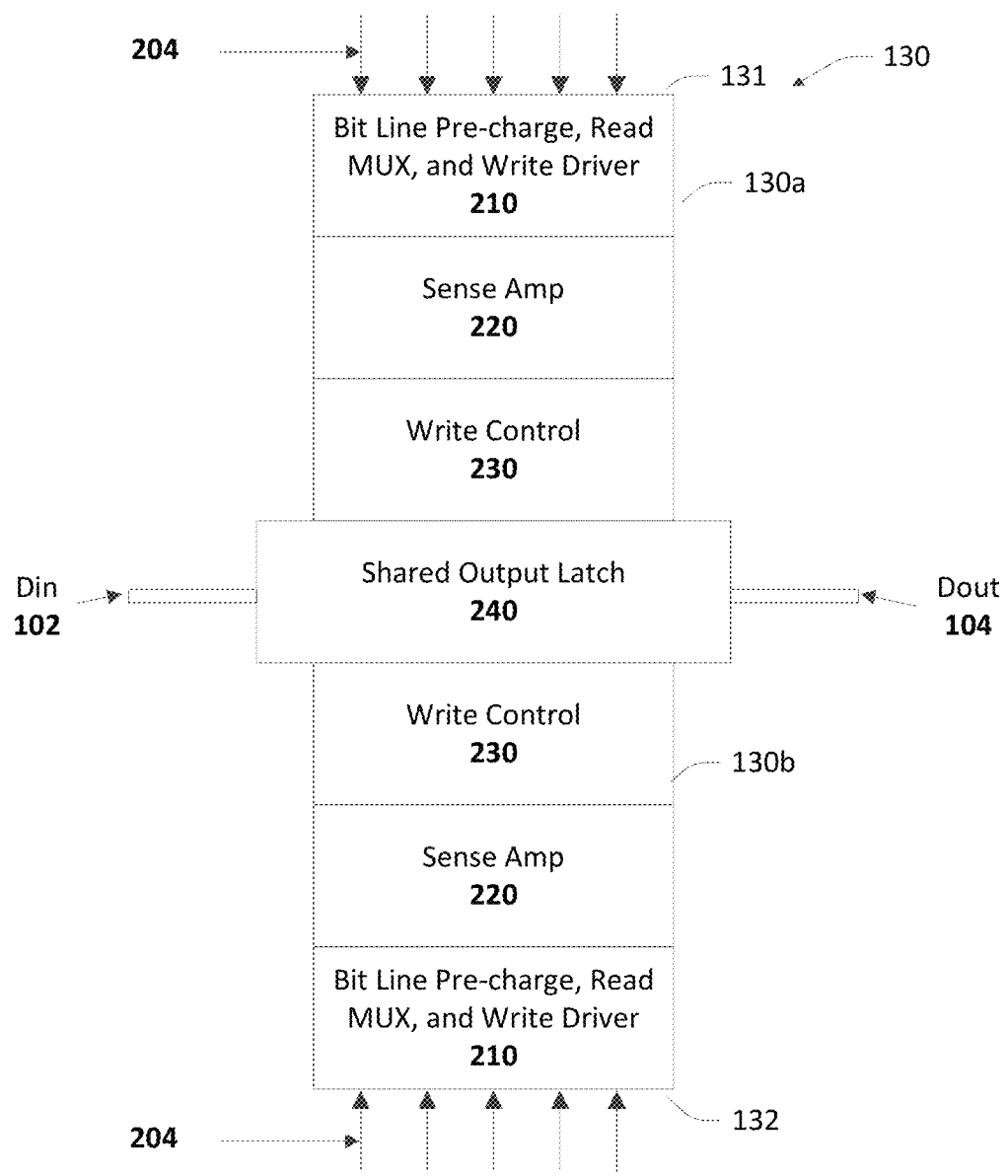
FIG. 9 is a block diagram illustrating a further example of a memory IO block in accordance with some embodiments.

FIG. 9 depicts another example where the output latch 240 is shared by both IO blocks 130a, 130b. In other words, the single output latch block 240 functions to latch output signals received on the bit lines 204 from both the first and second sub arrays 105a, 105b. Other IO function blocks are repeated, such that the bit lines 204 of the first and second sub arrays 105a, 105b have a respective bit line pre-charge, read MUX and write driver block 210, sense amp 220, and write control 230. Again, the data IO layer including the Din 102 and Dout 104 terminals is situated between the upper and lower control blocks 130a, 130b.

Figure 10:
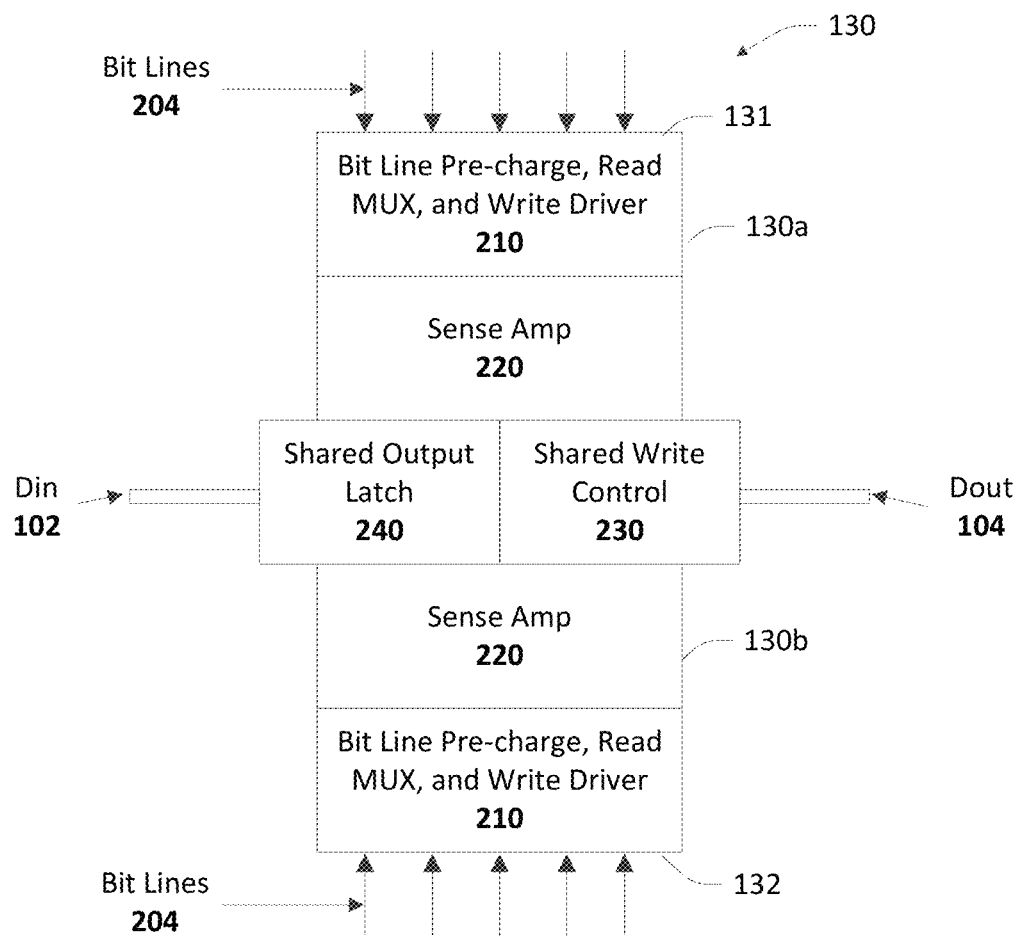
FIG. 10 is a block diagram illustrating a further example of a memory IO block in accordance with some embodiments.

FIG. 10 illustrates yet another example where additional IO functions are shared between the first and second sub arrays 105a. 105b. More particularly, the output latch 240 and write control 230 functions are both shared by IO blocks 130a, 130b. In other words, the single output latch block 240 and single write control 230 directly receive signals on the bit lines 204 from both the first and second sub arrays 105a, 105b. Other IO function blocks are provided in both the upper and lower IO blocks 130a, 130b, such that the bit lines 204 of the first and second sub arrays 105a, 105b have a respective bit line pre-charge, read MUX and write driver block 210, and sense amp 220. Again, the data IO layer including the Din 102 and Dout 104 terminals is situated between the upper and lower control blocks 130a, 130b.

Figure 11:
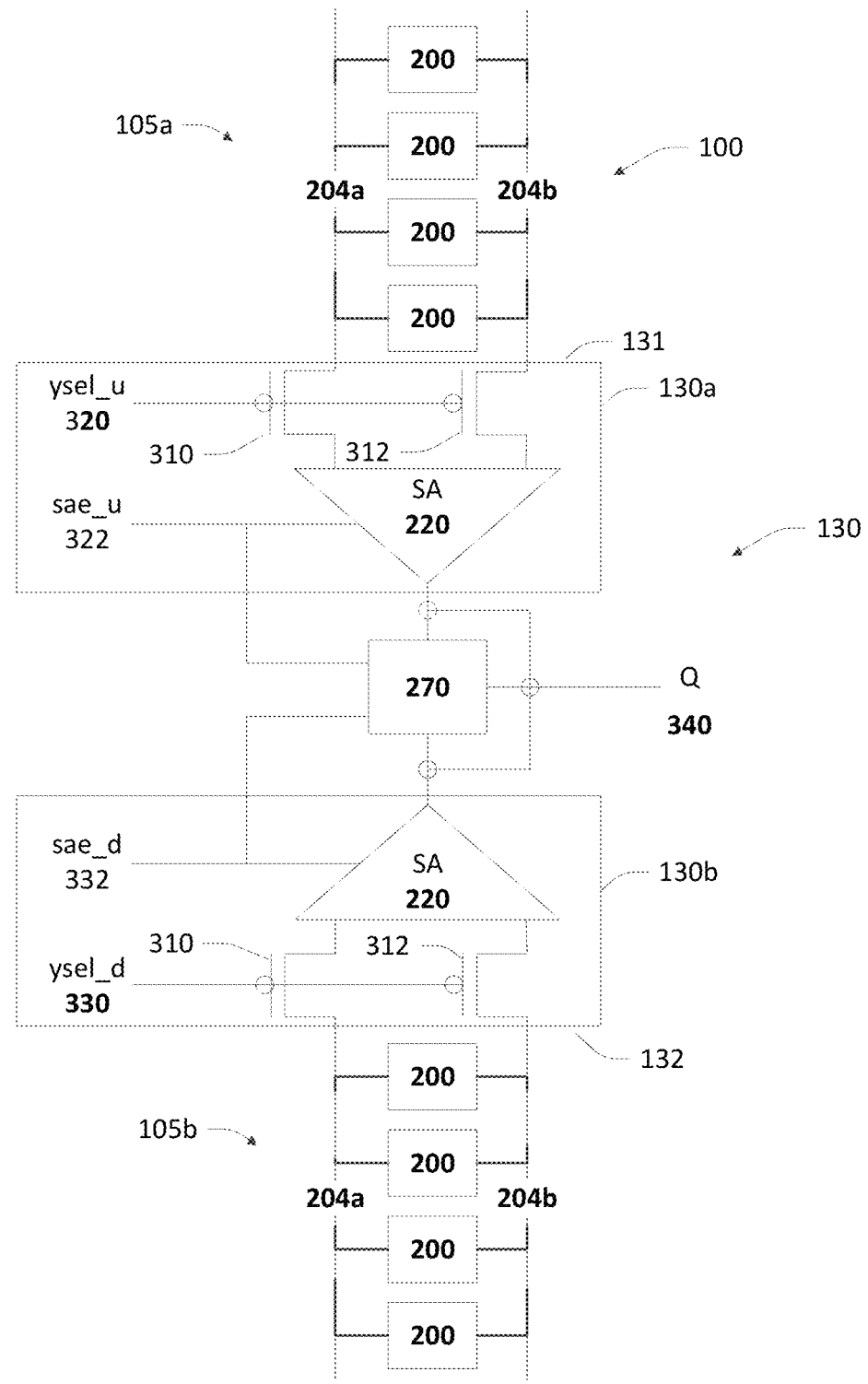
FIG. 11 is a circuit diagram illustrating a further example of a memory device in accordance with some embodiments.

FIG. 11 is a circuit diagram illustrating aspects of another example memory device 100, where IO blocks 130a, 130b are situated adjacent one another between first and second memory sub arrays 105a, 105b and share a common output latch 270. FIG. 11 shows portions of a single column of memory cells 200 of the first and second memory cell arrays 105a, 105b, which are located between two bit lines 204a, 204b. The bit lines 204b are bar bit lines, carrying signals complementary to those on the bit lines 204a. The memory cells 200 connected to corresponding word lines, which extend in horizontal rows perpendicular to the bit lines 204a, 204b in the example shown in FIG. 11. The word lines are activated in response to word line select signals output by the word line driver 120 shown in FIG. 1.

In a read operation, the word line driver 120 decodes the selected word line based on a received word line address. Column select signals ysel_u 320 and/or ysel_d 330 are received at respective gate terminals of transistors 310 and 312 to select the desired columns of the memory array 105. In response to the column select signals 320, 330, data signals from the selected rows of memory cells 200 are output to respective sense amplifiers 220 of the first and second IO blocks 130a, 130b. In some examples, the word line driver 120 is configured to select a row from only the upper array 105a or the lower array 105b, but not both, during a particular read operation. Accordingly, only a selected row from the upper array 105a or the lower array 105b is sending data along the bit lines 204a, 204b to the appropriate control block 130a, 130b. The complementary signals from the selected memory cells 200 on the bit lines 204a, 204b are received by the sense amplifiers 220, which outputs the amplified data signals to the shared output latch 240 in response to the sense amplifier enable signals sae_u 322 or sae-d 332. The data signals are output by the shared output latch 270 on the output pin Q 340. In some examples, the outputs of the sense amplifiers 220 are configured with tri-state logic, where the output of the sense amplifier 220 may assume a high impedance state in addition to the 0 and 1 logic levels. This allows the particular sense amplifier output to effectively be removed from the circuit until new data is available. In this way, the two sense amp outputs can be tied together without additional delay that would be caused by another level of multiplexors.

Figure 12:
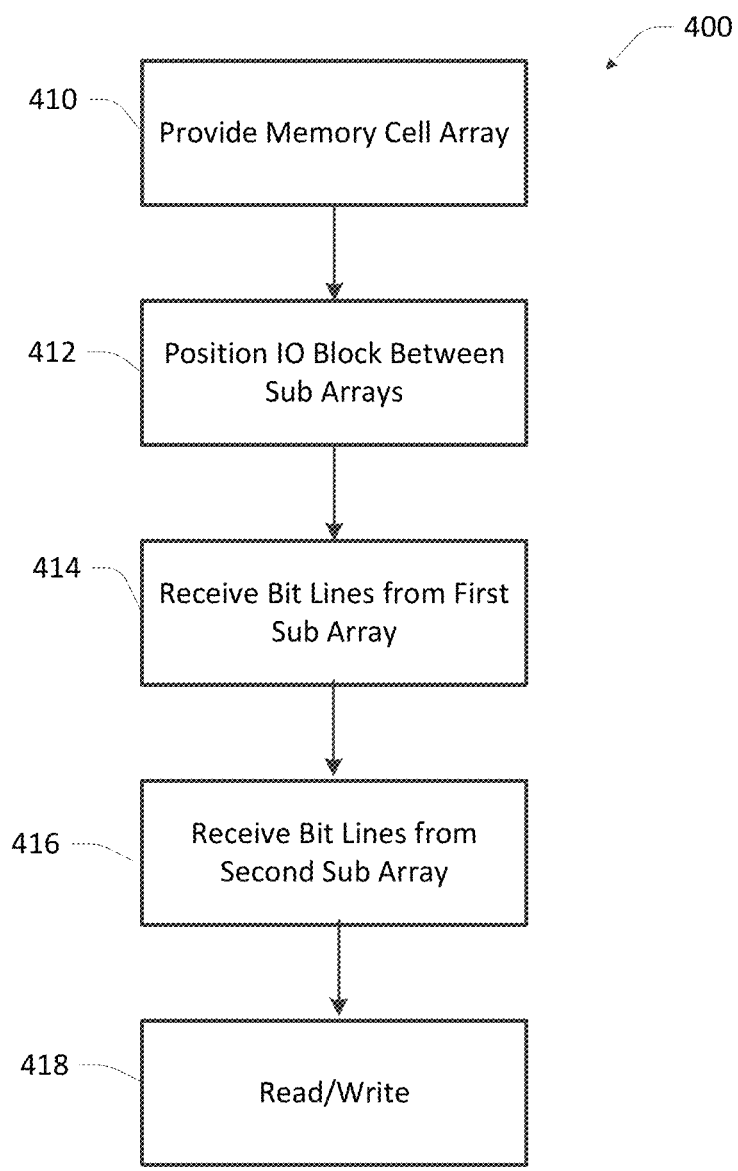
FIG. 12 is a flow diagram illustrating an example of a memory IO method in accordance with some embodiments.

FIG. 12 is a block diagram illustrating an IO method 400 corresponding to the various embodiments disclosed herein. In operation block 410, an array of memory cells is provided, such as the array 105 shown in FIG. 4. An IO block 130 is positioned so as to divide the array 105 of memory cells into a first sub array 105a and a second sub array 105b situated on opposite sides of the IO block 130 in block 412. In block 414, bit lines 204 connected to the memory cells of the first sub array 105a are received at a first side 131 of the IO block 130, and in block 416, bit lines 204 connected to the memory cells of the second sub array 105b are received at a second side 132 of the IO block 130. As such, the IO block 130 is situated between the memory arrays 105a, 105b. Data signals are thus received directly from and output directly to the shortened bit lines that extend to the centrally located control block 130, rather than requiring additional global bit lines to transmit the data signals to a global IO block. The IO block 130 is operated to read data from and write data to the memory cells of the first and second sub arrays, and output and receive the data via output and input terminals 104, 102 of the centrally located IO block 130 as shown in block 418.

Various examples disclosed herein thus provide a memory array with shortened bit lines that are directly received by an IO block positioned between sub arrays of the memory array. In this manner, performance is improved via the shortened bit lines. Moreover, by the centrally located IO block being directly connected to the bit lines of the memory sub arrays, a global IO block is not necessary, which saves macro space and further improves performance.

In accordance with some disclosed embodiments, a memory device, such as an SRAM memory, has an array of memory cells that includes a first sub array and a second sub array. A plurality of bit lines are connected to the memory cells, and an IO block is situated between the first sub array and the second sub array. The bit lines extend from the first and second memory sub arrays of the memory device directly to the IO block. The IO block further includes data input and output terminals configured to receive data to be written to the array of memory cells and output data read from the array of memory cells via the plurality of bit lines In accordance with further examples, a memory IO includes an IO block having a first side and a second side opposite the first side. The first side is configured to receive a first plurality of bit lines from a first memory sub array, and the second side is configured to receive a second plurality of bit lines from a second memory sub array. The IO block has an output latch coupled to receive data read from the first plurality of bit lines and the second plurality of bit lines. Data input and output terminals are configured to receive and output data to and from the plurality of bit lines.

In accordance with other examples, a memory IO method includes providing an array of memory cells. An IO block is positioned so as to divide the array of memory cells into a first sub array and a second sub array situated on opposite sides of the IO block. A first plurality of bit lines connected to the memory cells of the first sub array is received at a first side of the IO block, and a second plurality of bit lines connected to the memory cells of the second sub array is received at a first side of the IO block. The IO block is operated to read data and write data to and from the memory cells of the first and second sub arrays.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A memory device, comprising:
an array of SRAM memory cells, the array including a first sub array and a second sub array;
a first plurality of bit lines connected to the memory cells of the first sub array;
a second plurality of bit lines connected to the memory cells of the second sub array;
an IO block situated between the first sub array and the second sub array, wherein the first plurality of bit lines extend from the first sub array directly to the IO block, the second plurality of bit lines extend from the second sub array directly to the IO block and wherein the IO block includes data input and output terminals configured to receive data to be written to the first and second arrays and output data read from the first and second arrays the first plurality of bit lines and the second plurality of bit lines.

2. The memory device of claim 1, wherein the IO block includes an output latch coupled to receive data read from the first plurality of bit lines and the second plurality of bit lines.

3. The memory device of claim 1, wherein:
the memory cells of the first and second sub arrays are arranged in columns and rows;
the bit lines extend parallel to the columns; and
the IO block is situated across the columns, perpendicular to the bit lines.

4. The memory device of claim 2, further comprising:
a plurality of word lines connected to the memory cells and extending parallel to the rows; and
a row decoder connected to the plurality of word lines.

5. The memory device of claim 4, wherein the array further includes a third sub array and a fourth sub array, wherein the first sub array and third sub array are positioned on a first side of the IO block and the second sub array and the fourth sub array are positioned on a second side of the IO block opposite the first side, and wherein the first sub array and the second sub array are positioned on a first side of the row decoder and the third sub array and the fourth sub array are positioned on a second side of the row decoder.

6. The memory device of claim 2, wherein the IO block includes:

a first sense amplifier coupled to receive data from the first plurality of bit lines and not the second plurality of bit lines, and provide a first output to the output latch; and a second sense amplifier coupled to receive data from the second plurality of bit lines and not the first plurality of bit lines, and provide a second output to the output latch.

7. The memory device of claim 6, wherein the IO block includes a first read multiplexer coupled to receive data from the first plurality of bit lines and provide a first output to the first sense amplifier; and a second read multiplexer coupled to receive data from the second plurality of bit lines and provide a second output to the second sense amplifier.

8. The memory device of claim 7, wherein the IO block includes a write controller coupled to the first plurality of bit lines and the second plurality of bit lines.

9. The memory device of claim 6, wherein the first and second sense amplifiers are configured to receive respective first and second enable signals.

10. The memory device of claim 9, wherein the first and second sense amplifiers are configured with tri-state logic.

11. A memory input/output (TO), comprising:

a first side and a second side opposite the first side, the first side configured to receive a first plurality of bit lines from a first memory sub array having a plurality of SRAM cells, the second side configured to receive a second plurality of bit lines from a second memory sub array having a plurality of SRAM cells;

a first read multiplexer coupled to receive data from the first plurality of bit lines, and configured provide a first output in response to a first column select signal;

a second read multiplexer coupled to receive data from the second plurality of bit lines, and configured provide a second output in response to a second column select signal;

an output latch coupled to receive the first and second outputs from the first and second read multiplexers; and a data output terminal configured to provide an output from the output latch.

12. The memory IO of claim 11, wherein the memory IO is situated between the first and second sub arrays.

13. The memory IO of claim 11, wherein the SRAM memory cells of the first and second sub arrays are arranged in columns and rows with the bit lines extending parallel to the columns, and wherein the memory IO is situated across the columns perpendicular to the bit lines.

14. The memory IO of claim 11, further comprising a write controller configured to receive data from a data input terminal and configured to write the data to the first and second plurality of bit lines.

15. The memory IO of claim 11, further comprising:

a first sense amplifier coupled to receive the first output from the first read multiplexer and provide the first output to the output latch; and a second sense amplifier coupled to receive the second output from the second read multiplexer and provide the second output to the output latch.

16. A memory input/output (TO) method, comprising:

providing an array of SRAM memory cells;

positioning an IO block so as to divide the array of SRAM memory cells into a first sub array and a second sub array situated on opposite sides of the IO block;

receiving a first plurality of bit lines connected to the SRAM memory cells of the first sub array at a first side of the IO block;

receiving a second plurality of bit lines connected to the SRAM memory cells of the second sub array at a second side of the IO block;

operating the IO block to receive data from the SRAM memory cells of the first sub array by a first read multiplexer;

operating the IO block to output data from the first read multiplexer to a first sense amplifier in response to a first column select signal;

operating the IO block to output data from the first sense amplifier to an output latch in response to a first sense amplifier enable signal;

operating the IO block to receive data from the SRAM memory cells of the second sub array by a second read multiplexer;

operating the IO block to output data from the second read multiplexer to a second sense amplifier in response to a second column select signal; and operating the IO block to output data from the second sense amplifier to the output latch in response to a second sense amplifier enable signal.

17. The method of claim 16, further comprising operating the IO block to write data to the memory cells of the first and second sub arrays.

18. The method of claim 16, wherein the memory cells of the first and second sub arrays are arranged in columns and rows, and wherein the bit lines extend parallel to the columns, and wherein the method further comprises the situating the TO block across the columns, perpendicular to the bit lines.

19. The method of claim 18, further comprising situating a row decoder parallel to the word lines so as to form a third sub array and a fourth sub array on opposite sides of the row decoder.

20. The method of claim 16, wherein positioning the IO block so as to divide the array of memory cells into the first sub array and the second sub array includes positioning first and second IO blocks that include the IO block so as to divide the array of memory cells into the first sub array and the second sub array.

* * * * *